United States Patent
Zhang et al.

(10) Patent No.: US 11,521,826 B2
(45) Date of Patent: Dec. 6, 2022

(54) OPTICAL HEIGHT DETECTION SYSTEM

(71) Applicant: ASML Netherlands B.V., Veldhoven (NL)

(72) Inventors: Jian Zhang, San Jose, CA (US); Zhiwen Kang, San Jose, CA (US); Yixiang Wang, Fremont, CA (US)

(73) Assignee: ASML Netherlands B.V., Veldhoven (NL)

(*) Notice: Subject to any disclaimer, the term of this patent is extended or adjusted under 35 U.S.C. 154(b) by 243 days.

(21) Appl. No.: 16/650,840

(22) PCT Filed: Sep. 21, 2018

(86) PCT No.: PCT/EP2018/075621
§ 371 (c)(1),
(2) Date: Mar. 25, 2020

(87) PCT Pub. No.: WO2019/063433
PCT Pub. Date: Apr. 4, 2019

(65) Prior Publication Data
US 2020/0279715 A1    Sep. 3, 2020

Related U.S. Application Data

(60) Provisional application No. 62/564,994, filed on Sep. 28, 2017.

(51) Int. Cl.
*H01J 37/22*       (2006.01)
*G01C 3/08*        (2006.01)
*G02B 27/42*       (2006.01)

(52) U.S. Cl.
CPC ............ *H01J 37/228* (2013.01); *G01C 3/08* (2013.01); *G02B 27/4205* (2013.01); *H01J 2237/2482* (2013.01); *H01J 2237/24578* (2013.01)

(58) Field of Classification Search
CPC ........ H01J 37/22; H01J 37/226; H01J 37/228; H01J 2237/24578; H01J 2237/2482; G01C 3/08; G02B 27/4205
See application file for complete search history.

(56) References Cited

U.S. PATENT DOCUMENTS 5,602,399 A * 2/1997 Mizutani ............... G03F 9/7026
                                                        250/548
6,040,909 A   3/2000 Hasegawa et al.
(Continued)

FOREIGN PATENT DOCUMENTS

JP    11-149895      6/1999
JP    2008-233342 A  10/2008

OTHER PUBLICATIONS

International Search Report issued in related PCT Application No. PCT/EP2018/075621, dated Jan. 11, 2019 (3 pgs.).
(Continued)

*Primary Examiner* — David E Smith
(74) *Attorney, Agent, or Firm* — Finnegan, Henderson, Farabow, Garrett & Dunner, LLP

(57) ABSTRACT

An optical height detection system in a charged particle beam inspection system. The optical height detection system includes a projection unit including a modulated illumination source, a projection grating mask including a projection grating pattern, and a projection optical unit for projecting the projection grating pattern to a sample; and a detection unit including a first detection grating mask including a first detection grating pattern, a second detection grating mask including a second detection grating pattern, and a detection optical system for forming a first grating image from the projection grating pattern onto the first detection grating mask and forming a second grating image from the projection grating pattern onto the second detection grating masks.
(Continued)

The first and second detection grating patterns at least partially overlap the first and second grating images, respectively.

15 Claims, 4 Drawing Sheets

(56) References Cited

U.S. PATENT DOCUMENTS

| | | | | |
|---|---|---|---|---|
| 6,320,658 | B1 * | 11/2001 | Mizutani | G03F 9/7026 |
| | | | | 250/548 |
| 6,924,884 | B2 * | 8/2005 | Boonman | G03F 9/7096 |
| | | | | 355/75 |
| 7,767,982 | B2 | 8/2010 | Wang et al. | |
| 2006/0133661 | A1 | 6/2006 | Takeda et al. | |
| 2008/0302974 | A1 * | 12/2008 | Wang | H01J 37/21 |
| | | | | 250/442.11 |

OTHER PUBLICATIONS

Notification of Reason(s) for Refusal issued in related Korean Patent Application No. 10-2020-7008906; dated Nov. 12, 2021 (12 pgs.).

* cited by examiner

OPTICAL HEIGHT DETECTION SYSTEM

CROSS-REFERENCE TO RELATED APPLICATIONS

This application is a national stage filing under 35 U.S.C. § 371 of International Application No. PCT/EP2018/075621, filed on Sep. 21, 2018, and published as WO 2019/063433 A1, which claims priority of U.S. Provisional Application No. 62/564,994, which was filed on Sep. 26, 2017, and all of which are incorporated herein by reference in their entireties.

TECHNICAL FIELD

The present disclosure generally relates to an optical height detection system in a charged particle beam inspection system.

BACKGROUND

A charged particle beam based microscope, such as a scanning electron microscope (SEM) or a transmission electron microscope (TEM), is capable of providing image resolution down to less than a nanometer, and thus serves as a practicable tool for inspecting samples having a feature size that is sub-100 nanometers. The charged particle beam based microscope focuses and scans a beam of charged particles on a sample and detects secondary particles reflected from the sample.

An optical system is usually included in the charged particle beam based microscope to detect sample height so as to control focusing conditions of the beam of charged particles. It is desirable for the optical system to provide precise height detection result and fast detection speed.

SUMMARY

According to some embodiments of the disclosure, an optical height detection system in a charged particle beam inspection system is provided. The optical height detection system includes a projection unit including a modulated illumination source, a projection grating mask including a projection grating pattern, and a projection optical unit for projecting the projection grating pattern to a sample; and a detection unit including a first detection grating mask including a first detection grating pattern, a second detection grating mask including a second detection grating pattern, and a detection optical system for forming a first grating image from the projection grating pattern onto the first detection grating mask and forming a second grating image from the projection grating pattern onto the second detection grating masks. The first and second detection grating patterns at least partially overlap the first and second grating images, respectively.

According to some embodiments of the disclosure, a method for operating an optical height detection system in an inspection system is provided. The method includes: illuminating, by a modulated illumination source, a projection grating mask including a projection grating pattern; projecting, by a projection optical unit, the projection grating pattern to a sample; and forming, by a detection optical system, a first grating image onto the first detection grating mask and a second grating image onto the second detection grating mask. The first and second detection grating patterns at least partially overlap the first and second grating images, respectively.

BRIEF DESCRIPTION OF THE DRAWINGS

The accompanying drawings, which are incorporated in and constitute a part of this specification, illustrate several embodiments.

DETAILED DESCRIPTION

Reference will now be made in detail to the example embodiments, which are illustrated in the accompanying drawings. Although the following embodiments are described in the context of utilizing electron beams, the disclosure is not so limited. Other types of charged particle beams can be similarly applied.

The disclosed embodiments provide an optical height detection system used in a charged particle beam inspection system. The optical height detection system illuminates a projection grating mask by using a modulated illumination light, forms two grating images on two detection grating masks, and determines a sample height based on light intensity through the two detection grating masks. Such optical height detection system has a simple structure and is less sensitive to zero drifting, thus can provide accurate detection result.

Figure 1:
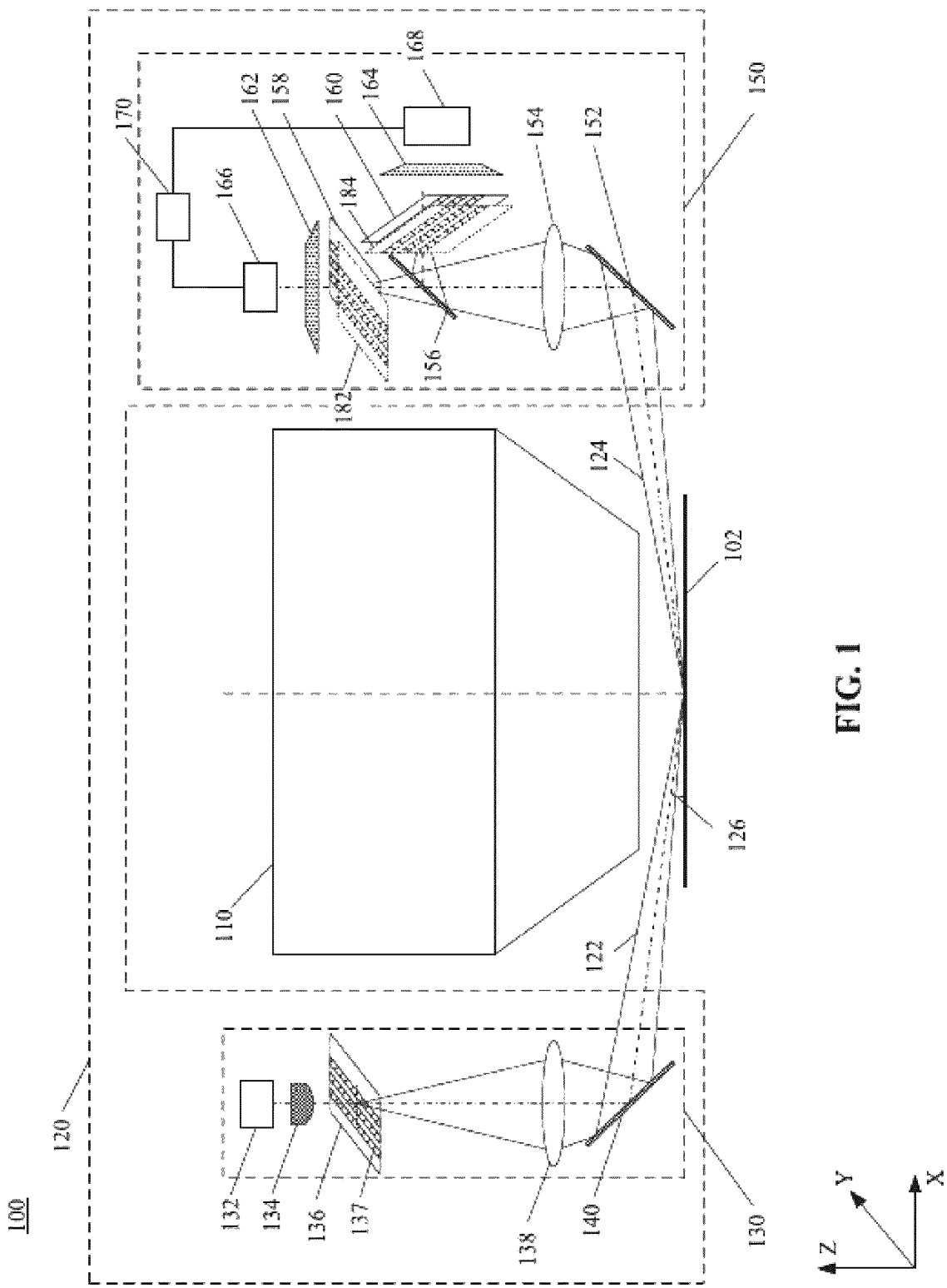
FIG. 1 is a schematic diagram of an exemplary charged particle beam inspection system with an exemplary optical height detection system consistent with some disclosed embodiments.

FIG. 1 is a schematic diagram of an exemplary charged particle beam inspection system 100 with an exemplary optical height detection system 120 consistent with some disclosed embodiments. Charged particle beam inspection system 100 includes a charged particle beam column 110 and optical height detection system 120. Charged particle beam column 110 irradiates a charged particle beam (e.g., electron beam) on an inspected sample 102 (e.g., a semiconductor wafer or any other specimen) and detects a charged particle beam reflected from sample 102. Optical height detection system 120 detects and calibrates a height of sample 102 (e.g., a position of sample 102 along a Z-direction illustrated in FIG. 1). Optical height detection system 120 includes a projection unit 130 for projecting an illumination light 122 to sample 102, and a detection unit 150 for detecting a reflected light 124 reflected from sample 102 and determining a height of sample 102 based on the detected light. Projection unit 130 includes a modulated illumination source including a modulation unit 132 and an illumination source 134, a projection grating mask 136, and a projection optical unit including a projection lens 138, and a reflection mirror 140. Detection unit 150 includes a detection optical unit including a reflection mirror 152, a receiving lens 154, and a beam splitter 156, a first detection grating mask 158, a second detection grating mask 160, a first photodetector 162, a second photodetector 164, a first demodulation unit 166, a second demodulation unit 168, and a processing unit 170. During the operation of charged particle beam inspection system 100, modulation unit 132, first demodulation unit 166, second demodulation unit 168, and processing unit 170 are disposed under atmospheric conditions, while charged particle beam column 110, the other components of optical height detection system 120, and sample 102 are disposed under vacuum conditions.

Illumination source 134 is configured to generate illumination light 122. Illumination source 134 can be, but not limited to, a light emitted diode (LED), a metal halide lamp, a xenon arc lamp, a fiber optic light source, a helium neon laser, a solid state laser diode, or any other light source known in the art. The illumination light can include monochromatic light or broadband light.

Modulation unit 132 is coupled to illumination source 134 to modulate illumination light 122 in order to achieve reasonable noise rations. In some embodiments, illumination source 134 can include an LED, and modulation unit 132 can be an analog circuit coupled to the LED to modulate a power supplied to the LED, so as modulate the light generated by the LED. Illumination light 122 can be amplitude modulated, frequency modulated, or phase modulated, etc., by modulation unit 132. Modulation unit 132 and illumination source 134 together constitute a modulated illumination source.

Projection grating mask 136 includes a substrate and a projection grating pattern formed on the substrate. The projection grating pattern includes a plurality of grating members 137 arranged periodically along a direction parallel to the sample. Assuming that a direction orthogonal to a major surface of sample 102 is a Z-direction, a direction crossing the Z-direction is an X-direction, and a direction crossing the Z-direction and the X-direction is a Y-direction. In the exemplary embodiment illustrated in FIG. 1, projection grating mask 136 is arranged parallel to an X-Y plane. Grating members 137 extend along the Y-direction, and are arranged periodically along the X-direction. Grating member 137 can have various shapes. In the exemplary embodiment illustrated in FIG. 1, grating members 137 lines having a rectangular shape. Alternatively, in some other embodiments, grating member 137 can be lines having a wave shape. Grating members 137 can have various dimensions (e.g., length, width) and various spaces between one another. For example, the grating members can be lines with a length of 500 μm, a width of 6 μm, and the space between the lines can be 9 μm. A light transmittance of grating members 137 is lower than a light transmittance of the substrate.

When the modulated illumination source emits illumination light 122 downward along the Z-direction, projection grating mask 136 having the projection grating pattern is illuminated. Consequently, illumination light 122 carries the projection grating pattern of projection grating mask 136. Illumination light 122 is conjugated by projection lens 138, and is then reflected by reflection mirror 140 towards sample 102 at an incidence angle 126 in respect to the surface of sample 102. For example, incidence angle 126 can be, for example, about 4° to 7°. In some other examples, incidence angle 126 can be larger than 4° to 7°. For example, incidence angle 126 can be 15°. At a surface of sample 102, illumination light 122 is reflected by sample 102 to become reflected light 124 that is directed towards detection unit 150.

In detection unit 150, reflected light 124 is further reflected by reflection mirror 152 upward along the Z-direction towards receiving lens 154, and is conjugated by receiving lens 154. A portion of the conjugated light passes through beam splitter 156 to form a first grating image 182 on first detection grating mask 158, and a portion of the conjugated light is reflected by beam splitter 156 to form a second grating image 184 on second detection grating mask 160. First photodetector 162 detects a light intensity through first detection grating mask 158 to generate a first voltage signal, and second photodetector 164 detects a light intensity through second detection grating mask 160 to generate a second voltage signal. In some embodiments, first photodetector 162 and second photodetector 164 can include photodiodes. First demodulation unit 166 demodulates the first voltage signal to obtain a first signal strength, and second demodulation unit 168 demodulates the second voltage signal to obtain a second signal strength. Processing unit 170 determines a height of sample 102 based on the first signal strength and the second signal strength.

First detection grating mask 158 includes a substrate and a first detection grating pattern formed on the substrate. The substrate of first detection grating mask 158 is arranged parallel to the X-Y plane. The first detection grating pattern includes a plurality of grating members (e.g., lines) that extend along the Y-direction and are arranged periodically along the X-direction. A light transmittance of the grating members of first detection grating mask 158 is lower than a light transmittance of the substrate of first detection grating mask 158.

Second detection grating mask 160 includes a substrate and a second detection grating pattern formed on the substrate. The substrate of second detection grating mask 160 is arranged parallel to the Y-Z plane. The second detection grating pattern includes a plurality of grating members (e.g., lines) that extend along the Y-direction, and are arranged periodically along the Z-direction. A light transmittance of the grating members of second detection grating mask 160 is lower than a light transmittance of the substrate of the second detection grating mask 160. The shapes and dimensions of the grating members in the first and second detection grating patterns are substantially the same as those in the projecting grating pattern of projection grating mask 136.

Figure 2:
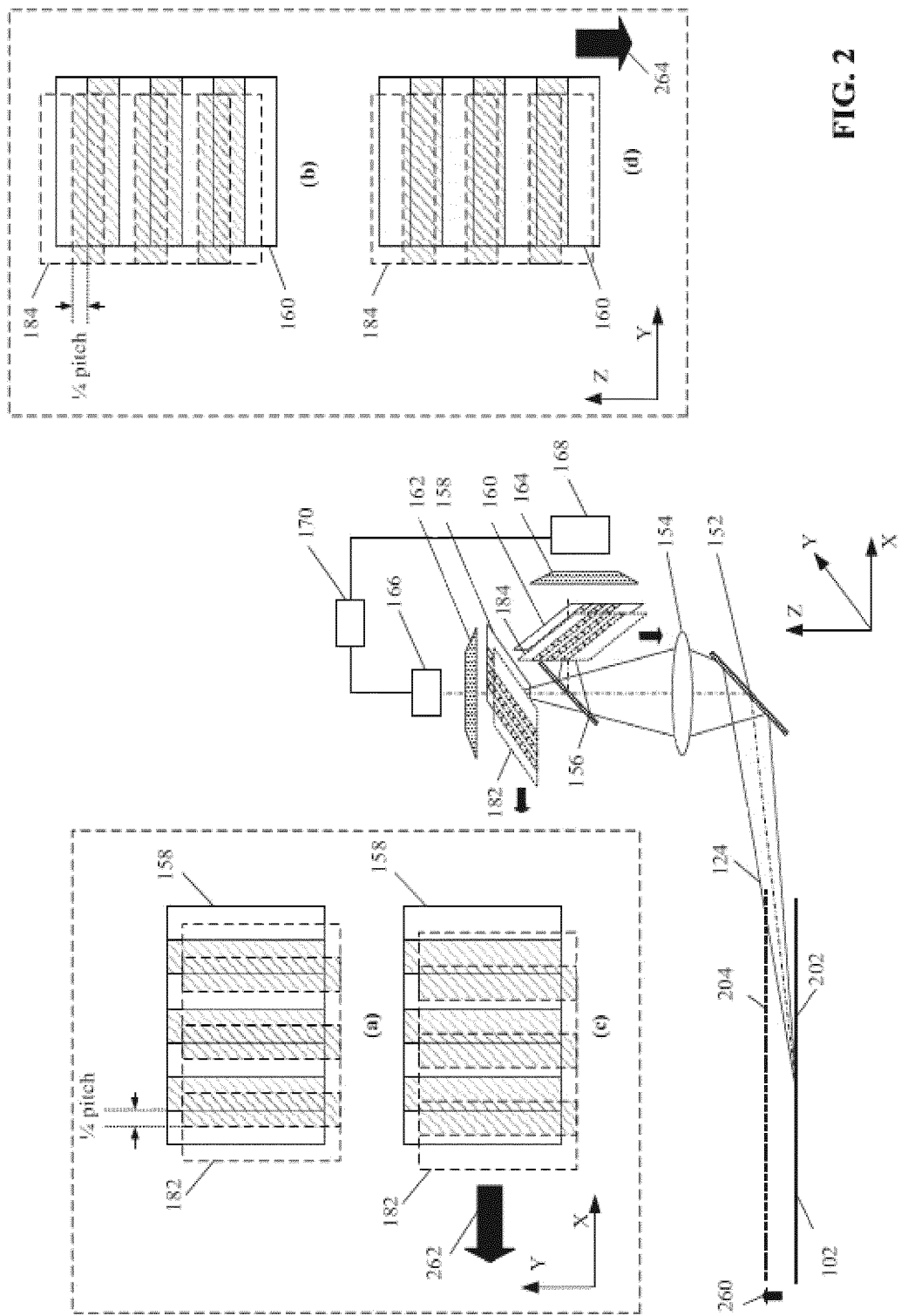
FIG. 2 is a schematic diagram illustrating an exemplary operation mechanism of an optical height detection system, consistent with some disclosed embodiments.

FIG. 2 is a schematic diagram illustrating an operation mechanism of optical height detection system 120 of FIG. 1, consistent with some disclosed embodiments. For the simplicity of illustration, only sample 102 and the components in detection unit 150 are illustrated in FIG. 2.

When sample 102 is disposed at a nominal position 202, first grating image 182 generated from projection grating mask 136 partially overlaps first detection grating mask 158, and second grating image 184 generated from projection grating mask 136 partially overlaps second detection grating mask 160.

Insert (a) of FIG. 2 is a plan view of first grating image 182 and first detection grating mask 158 obtained when sample 102 is disposed at nominal position 202. Each one of first grating image 182 and first detection grating mask 158 includes a grating pattern having a plurality of non-transparent grating members (e.g., lines) extending along the Y-direction and arranged periodically along the X direction. The grating pattern of first detection grating mask 158 is displaced by ¼ grating period (¼ pitch) with respect to the grating pattern of first grating image 182 along the X-direction. Therefore, the grating members of first grating image 182 partially overlap the grating members of first detection grating mask 158, and only half of first grating image 182 passes through first detection grating mask 158 due to a shearing effect. In other words, only half of the light that passes through beam splitter 156 passes through first detection grating mask 158.

Insert (b) of FIG. 2 is a plan view of second grating image 184 and second detection grating mask 160 obtained when sample 102 is disposed at nominal position 202. Each one of second grating image 184 and second detection grating mask 160 includes a grating pattern having a plurality of non-transparent grating members (e.g., lines) extending along the Y-direction and arranged periodically along the Z-direction. The grating pattern of second detection grating mask 160 is displaced by ¼ grating period (¼ pitch) with respect to the grating pattern of second grating image 184 along the Z-direction. Therefore, the grating members of second grating image 184 partially overlap the grating members of second detection grating mask 160, and only half of second grating image 184 passes through second detection grating mask 160 due to a shearing effect. In other words, only half of the light that was reflected by beam splitter 156 passes through second detection grating mask 160.

If sample 102 moves up from nominal position 202 to a higher position 204 along the Z-direction as indicated by a vector 260, first grating image 182 moves to the left along the X-direction as indicated by a vector 262, and second grating image 184 moves down along the Z-direction as indicated by a vector 264.

Insert (c) of FIG. 2 is a plan view of first grating image 182 and first detection grating mask 158 obtained when sample 102 moves to the higher position 204. First grating image 182 moves to the left along the X-direction as indicated by vector 262. Therefore, the overlapping regions between the grating members of first grating image 182 and the grating members of first detection grating mask 158 decrease, and the portion of first grating image 182 that passes through first detection grating mask 158 increases. Consequently, the portion of light that passes through first detection grating mask 158 decreases. As a result, the light intensity of the light that passes through first detection grating mask 158 decreases.

Insert (d) of FIG. 2 is a plan view of second grating image 184 and second detection grating mask 160 obtained when sample 102 moves to the higher position 204. Second grating image 184 moves down along the Z-direction as indicated by vector 264. Therefore, the overlapping regions between the grating members of second grating image 184 and the grating members of second detection grating mask 160 increase, and the portion of second grating image 184 that passes through second detection grating mask 160 decreases. Consequently, the portion of light that passes through second detection grating mask 160 increases. As a result, the light intensity of the light that passes through second detection grating mask 160 increases.

Figure 3:
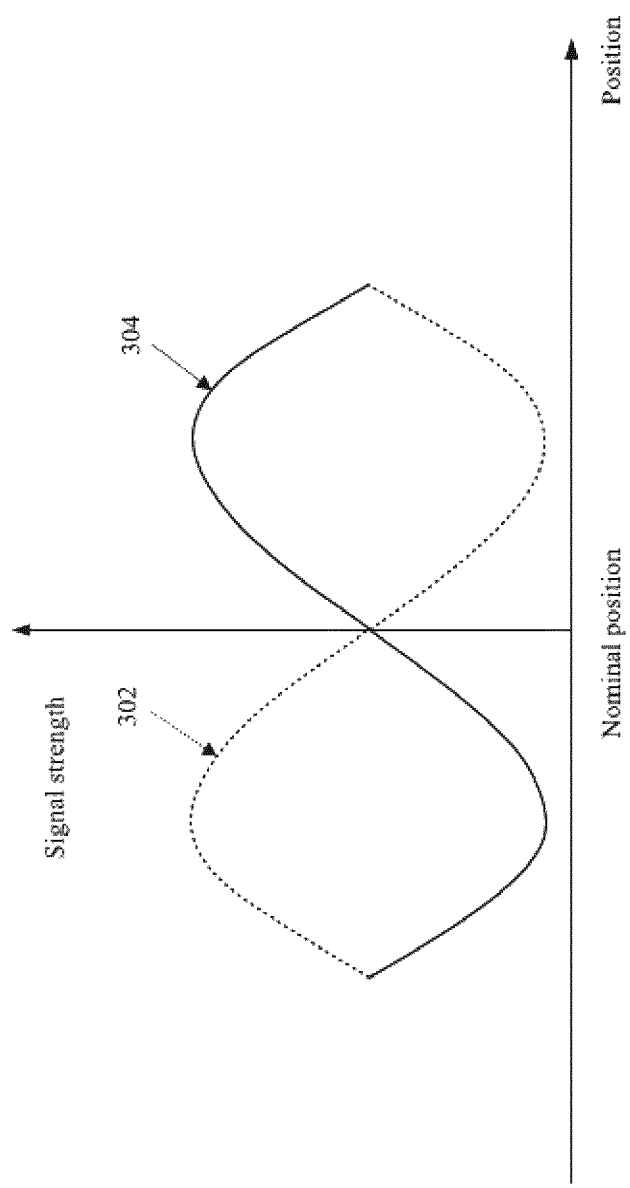
FIG. 3 is a graph representing an exemplary relationship between signal strength and sample position obtained from an exemplary optical height detection system.

FIG. 3 is a graph representing an exemplary relationship between signal strength and sample position obtained from optical height detection system 120 of FIG. 1. The horizontal axis represents a position of sample 102 with respect to nominal position 202 along the Z-direction, with a positive value representing a position above nominal position 202, and a negative value representing a position below nominal position 202. The vertical axis represents the signal strength. Curve 302 represents the signal strength obtained from the light passing through first detection grating mask 158 and detected by first photodetector 162. Curve 304 represents the signal strength obtained from the light passing through second detection grating mask 160 and detected by second photodetector 164.

As shown in FIG. 3, as sample 102 moves up from nominal position 202 along the Z-direction, the signal strength (i.e., curve 302) obtained from the light passing through first detection grating mask 158 decreases, while the signal strength (i.e., curve 304) obtained from the light passing through second detection grating mask 160 increases. Likewise, as sample 102 moves down from nominal position 202 along the Z-direction, the signal strength (i.e., curve 302) obtained from the light passing through first detection grating mask 158 increases, while the signal strength (i.e., curve 304) obtained from the light passing through second detection grating mask 160 decreases.

Therefore, before operating optical height detection system 120 to detect sample height, optical height detection system 120 can be calibrated using a calibration sample to determine a relationship between signal strength and sample position through each one of first detection grating mask 158 and second detection grating mask 160. Then, when optical height detection system 120 operates to detect the height of a sample, signal strength of the light passing through each one of first detection grating mask 158 and second detection grating mask 160 can be detected and compared to the relationship determined during the calibration process. In addition, the sample can be moved slightly upwards or downwards to determine whether the signal strengths increase or decrease. Then, the position of the sample can be determined based on the detection result.

Figure 4:
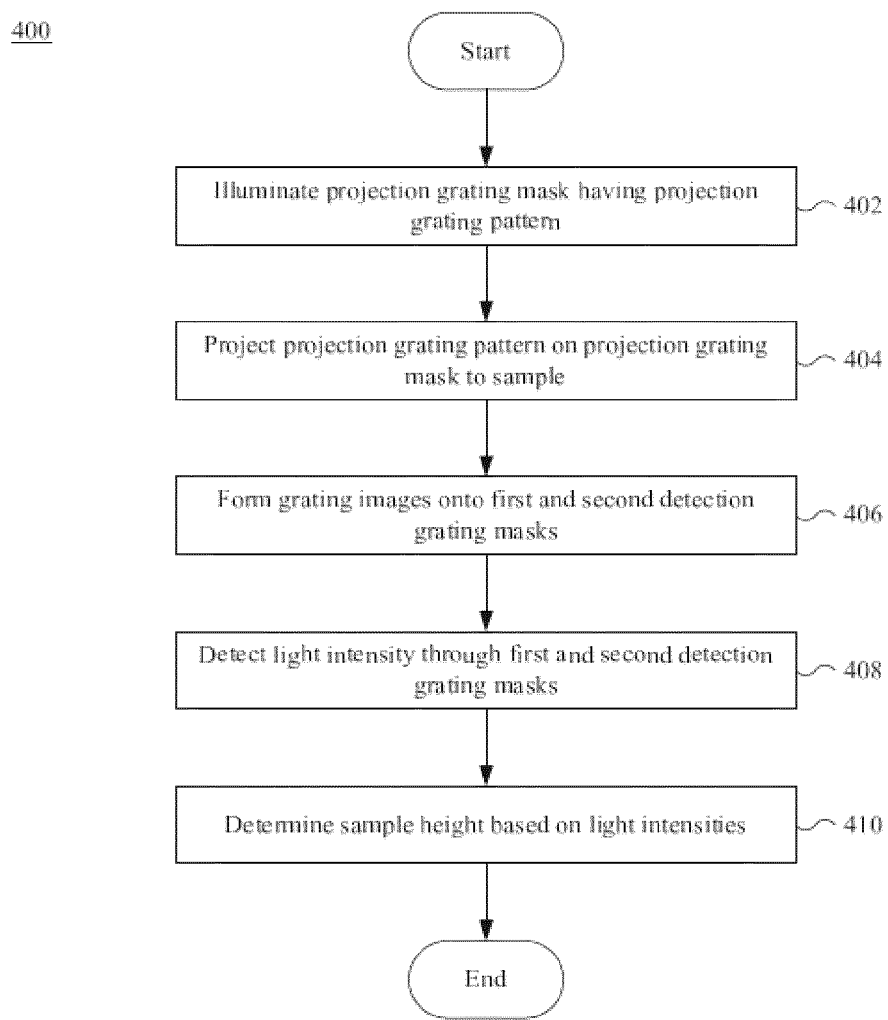
FIG. 4 is a flow chart of an exemplary process of operating an optical height detection system in a charged particle beam inspection system, consistent with some embodiments of the disclosure.

FIG. 4 is a flow chart of an exemplary process of operating an optical height detection system in a charged particle beam inspection system, consistent with some embodiments of the disclosure. The optical height detection system can be optical height detection system 120 illustrated in FIG. 1.

As illustrated in FIG. 4, first, at step 402, an illumination source (e.g., illumination source 134) produces an illumination light (e.g., illumination light 122) to illuminate a projection grating mask (e.g., projection grating mask 136) having a projection grating pattern. The illumination source can be modulated by a modulation unit (e.g., modulation unit 132).

At step 404, a projection optical unit projects the projection grating pattern on the projection grating mask to a sample. The projection optical unit can include a projection lens (e.g., projection lens 138) and a reflection mirror (e.g., reflection mirror 140). The projection grating pattern is projected to the sample at an incidence angle with respect to the surface of the sample.

At step 406, a detection optical unit forms a first grating image (e.g., first grating image 182) and a second grating image (e.g., second grating image 184) on a first detection grating mask (e.g., first detection grating mask 158) and a second detection grating mask (e.g., second detection grating mask 160), respectively. The detection optical unit can include a reflection mirror (e.g., reflection mirror 152), a receiving lens (e.g., receiving lens 154), and a beam splitter (e.g., beam splitter 156).

At step 408, a first photodetector (e.g., first photodetector 162) and a second photodetector (e.g., second photodetector 164) detect light intensities through the first detection grating mask and the second detection grating mask, respectively.

At step 410, a sample height is determined based on the light intensities, using the method explained with reference to FIGS. 2 and 3.

According to the above disclosed embodiments, optical height detection system 120 employs two detection grating masks 158 and 160 for detecting sample height. In comparison, systems that use only one detection grating mask and one photodetector for detecting sample height may suffer from zero drifting, i.e., drifting in threshold voltages of photodetectors, or drifting in illumination power. In contrast, optical height detection system 120 determines the sample height based on a comparison of the light intensities through the two detection grating masks 158 and 160, and therefore is less sensitive to zero drifting.

In another comparison, systems that detect the sample height based on a position of the grating image detected by a camera are limited by the speed of the camera, which is relatively slow. In contract, optical height detection system 120 according to the disclosed embodiments employs photodetectors 162 and 164 that can detect light intensities in a relatively faster speed. Consequently, optical height detection system 120 can detect the sample height in a relatively faster speed.

In still another comparison, systems using an incandescent lamp or a gas lamp for an illumination source and optical-electrical devices for modulating the illumination light results in a complicated structure, thereby making it difficult to effectively modulate the illumination light. In contrast, optical height detection system 120 according the above disclosed embodiments employs an LED as an illumination source, and employs a modulation unit to modulate a power supplied to the LED to modulate the light generated by the LED. Optical height detection system 120 also includes demodulation units for demodulating the voltage signals generated by the photodetectors. Compared to the comparison system, optical height detection system 120 has a simple structure and is relative easy to operate.

The embodiments may further be described using the following clauses:

1. An optical height detection system in a charged particle beam inspection system, comprising:
   a projection unit including:
   a modulated illumination source;
   a projection grating mask including a projection grating pattern; and
   a projection optical unit for projecting the projection grating pattern to a sample; and
   a detection unit including:
   a first detection grating mask including a first detection grating pattern;
   a second detection grating mask including a second detection grating pattern; and
   a detection optical system for forming a first grating image from the projection grating pattern onto the first detection grating mask and forming a second grating image from the projection grating pattern onto the second detection grating masks, wherein the first and second detection grating patterns at least partially overlap the first and second grating images, respectively.

2. The system of clause 1, wherein the projection grating pattern, the first detection grating pattern, and the second detection grating pattern have the same dimensions.

3. The system of any one of clauses 1 and 2, wherein the first detection grating pattern is displaced with the first grating image formed when the sample is located at a nominal height by a predetermined distance, and
   the second detection grating pattern is displaced with the second grating image formed when the sample is located at the nominal height by the predetermined distance.

4. The system of any one of clauses 1 through 3, wherein the detection unit includes:
   a first photodetector for detecting a first light intensity through the first detection grating mask to generate a first voltage signal; and
   a second photodetector for detecting a second light intensity through the second detection grating mask to generate a second voltage signal.

5. The system of clause 4, wherein each one of the first photodetector and the second photo detector includes a photodiode.

6. The system of any one of clauses 4 and 5, wherein the detector unit further includes:
   a first demodulation unit for demodulating the first voltage signal from the first detector to generate a first signal strength; and
   a second demodulation unit for demodulating the second voltage signal from the second detector to generate a second signal strength.

7. The system of any one of clauses 4 through 6, wherein the detection unit further includes:
   a processing unit for determine a height of the sample based on the first voltage signal and the second voltage signal.

8. The system of any one of clauses 1 through 7, wherein the modulated illumination source includes:
   an illumination source for providing an illumination light; and
   a modulation unit for modulating a power supplied to the illumination source.

9. The system of clause 8, wherein the illumination light is a broad-band light beam.

10. The system of any one of clauses 1 through 9, wherein the projection optical unit includes:
    a projection lens for conjugating the illumination light; and
    a first reflection mirror for reflecting the illumination light onto the sample in an angle.

11. The system of any one of clauses 1 through 10, wherein the detection optical system includes:
    a second reflection mirror for reflecting a light reflected from the sample;
    a receiving lens for conjugating the reflected light; and
    a beam splitter for splitting the conjugated illumination light onto the first and second detection grating masks.

12. The system of any one of clauses 1 through 11, wherein the charged particle beam inspection system is an electron beam inspection system.

13. A method for operating an optical height detection system in an inspection system, comprising:
    illuminating, by a modulated illumination source, a projection grating mask including a projection grating pattern;
    projecting, by a projection optical unit, the projection grating pattern to a sample; and
    forming, by a detection optical system, a first grating image onto the first detection grating mask and a second grating image onto the second detection grating mask, wherein the first and second detection grating patterns at least partially overlap the first and second grating images, respectively.

14. The method of clause 13, wherein projection grating pattern, the first detection grating pattern, and the second detection grating pattern have the same dimensions.

15. The method of any one of clauses 13 and 14, wherein the first detection grating pattern is displaced with the first grating image formed when the sample is located at a nominal height by a predetermined distance, and
    the second detection grating pattern is displaced with the second grating image formed when the sample is located at the nominal height by the predetermined distance.

16. The method of any one of clauses 13 through 15, further comprising:
    detecting, by a first photodetector, a first light intensity through the first detection grating mask to generate a first voltage signal; and detecting, by a second photodetector, a second light intensity through the second detection grating mask to generate a second voltage signal.

17. The method of clause 16, wherein each one of the first photodetector and the second photo detector includes a photodiode.

18. The method of any one of clauses 16 and 17, further comprising:
    demodulating, by a first demodulation unit, the first voltage signal from the first detector to generate a first signal strength; and
    demodulating, by a second demodulation unit, the second voltage signal from the second detector to generate a second signal strength.

19. The method of any one of clauses 16 through 18, further comprising:
    determining, by a processing unit, a height of the sample based on the first voltage signal and the second voltage signal.

20. The method of any one of clauses 13 through 19, further comprising:
    providing, by an illumination source, an illumination light; and
    modulating, by a modulation unit, a power supplied to the illumination source.

21. The method of clause 20, wherein the illumination light is a broad-band light beam.

22. The method of any one of clauses 13 through 21, further comprising:
    conjugating, by a projection lens, the illumination light; and
    reflecting, by a first reflection mirror, the illumination light onto the sample in an angle.

23. The method of any one of clauses 13 through 22, further comprising:
    reflecting, by a second reflection mirror, a light reflected from the sample;
    conjugating, by a receiving lens, the reflected light; and
    splitting, by a beam splitter, the conjugated illumination light onto the first and second detection grating masks.

24. The method of any one of clauses 13 through 23, wherein the charged particle beam inspection system is an electron beam inspection system.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An optical height detection system in a charged particle beam inspection system, comprising:
    a projection unit including:
        a modulated illumination source;
        a projection grating mask including a projection grating pattern; and
        a projection optical unit for projecting the projection grating pattern to a sample; and
    a detection unit including:
        a first detection grating mask including a first detection grating pattern;
        a second detection grating mask including a second detection grating pattern; and
        a detection optical system for forming a first grating image from the projection grating pattern onto the first detection grating mask and forming a second grating image from the projection grating pattern onto the second detection grating mask, wherein the first and second detection grating patterns at least partially overlap the first and second grating images, respectively.

2. The system of claim 1, wherein the projection grating pattern, the first detection grating pattern, and the second detection grating pattern have the same dimensions.

3. The system of claim 1, wherein the first detection grating pattern is displaced from the first grating image formed when the sample is located at a nominal height by a predetermined distance, and
    the second detection grating pattern is displaced from the second grating image formed when the sample is located at the nominal height by the predetermined distance.

4. The system of claim 1, wherein the detection unit includes:
    a first photodetector for detecting a first light intensity through the first detection grating mask to generate a first voltage signal; and
    a second photodetector for detecting a second light intensity through the second detection grating mask to generate a second voltage signal.

5. The system of claim 4, wherein each one of the first photodetector and the second photo detector includes a photodiode.

6. The system of claim 4, wherein the detector unit further includes:
    a first demodulation unit for demodulating the first voltage signal from the first detector to generate a first signal strength; and
    a second demodulation unit for demodulating the second voltage signal from the second detector to generate a second signal strength.

7. The system of claim 4, wherein the detection unit further includes:
    a processing unit for determine a height of the sample based on the first voltage signal and the second voltage signal.

8. The system of claim 1, wherein the modulated illumination source includes:
    an illumination source for providing an illumination light; and
    a modulation unit for modulating a power supplied to the illumination source.

9. The system of claim 8, wherein the illumination light is a broad-band light beam.

10. The system of claim 1, wherein the projection optical unit includes:
    a projection lens for conjugating the illumination light; and
    a first reflection mirror for reflecting the illumination light onto the sample in an angle.

11. The system of claim 1, wherein the detection optical system includes:
    a second reflection mirror for reflecting a light reflected from the sample;
    a receiving lens for conjugating the reflected light; and
    a beam splitter for splitting the conjugated illumination light onto the first and second detection grating masks.

12. A method for operating an optical height detection system in an inspection system, comprising:
    illuminating, by a modulated illumination source, a projection grating mask including a projection grating pattern;

projecting, by a projection optical unit, the projection grating pattern to a sample; and forming, by a detection optical system, a first grating image onto the first detection grating mask and a second grating image onto the second detection grating mask, wherein the first and second detection grating patterns at least partially overlap the first and second grating images, respectively.

13. The method of claim 12, wherein the first detection grating pattern is displaced from the first grating image formed when the sample is located at a nominal height by a predetermined distance, and the second detection grating pattern is displaced from the second grating image formed when the sample is located at the nominal height by the predetermined distance.

14. The method of claim 12, further comprising:

detecting, by a first photodetector, a first light intensity through the first detection grating mask to generate a first voltage signal; and detecting, by a second photodetector, a second light intensity through the second detection grating mask to generate a second voltage signal.

15. The method of claim 14, further comprising:

determining, by a processing unit, a height of the sample based on the first voltage signal and the second voltage signal.

* * * * *